United States Patent [19]

Byatt

[11] Patent Number: 5,304,823
[45] Date of Patent: Apr. 19, 1994

[54] AN EQUIPMENT PROTECTION SEMICONDUCTOR INTEGRATED CIRCUIT

[75] Inventor: Stephen W. Byatt, Bromham, United Kingdom

[73] Assignee: Texas Instruments Incorporated, Dallas, Tex.

[21] Appl. No.: 941,005

[22] Filed: Sep. 8, 1992

[30] Foreign Application Priority Data

Dec. 30, 1991 [GB] United Kingdom ................ 9127476

[51] Int. Cl.$^5$ ...................... H01L 29/74; H01L 29/72
[52] U.S. Cl. ..................................... 257/146; 257/177; 257/577; 257/587
[58] Field of Search ............... 257/146, 154, 177, 107, 257/577, 587, 565

[56] References Cited

U.S. PATENT DOCUMENTS

| | | | |
|---|---|---|---|
| 4,509,089 | 4/1985 | Svedberg | 361/100 |
| 4,529,998 | 7/1985 | Ladi et al. | 257/146 |
| 4,868,703 | 9/1989 | Borkowicz | 361/58 |

FOREIGN PATENT DOCUMENTS

| | | | |
|---|---|---|---|
| 53-118984 | 10/1978 | Japan | 257/146 |
| 2069787 | 8/1981 | United Kingdom | |
| 2104286 | 3/1983 | United Kingdom | |
| 2212682 | 7/1989 | United Kingdom | |
| 2218872 | 11/1989 | United Kingdom | |

OTHER PUBLICATIONS

Patent Abstracts of Japan, vol. 15, No. 390 (E-1118) Oct. 3, 1991 & JP-A-31 55 675 (Shindengen Electric).

*Primary Examiner*—Andrew J. James
*Assistant Examiner*—Ngan Van Ngo
*Attorney, Agent, or Firm*—Russell E. Baumann; Richard L. Donaldson; René E. Grossman

[57] ABSTRACT

A semiconductor integrated circuit is provided which can have a high holding current without the penalty of a high gate current. Such a circuit includes a PNPN device and junction bipolar transistor in which a further doped region of the same conductivity type as the transistor collector region and more heavily doped than the collector region prevents the devices affecting each other. The junction bipolar transistor has a current gain of at least 10 and base-collector and base-emitter junctions with reverse breakdown voltages of at least 50 volts. A PN diode can also be used in the circuit.

17 Claims, 1 Drawing Sheet

AN EQUIPMENT PROTECTION SEMICONDUCTOR INTEGRATED CIRCUIT

FIELD OF INVENTION

The present invention relates to a semiconductor integrated circuit which is especially suited to protecting electrical transmission systems from transient high voltages, for example, transient voltages caused by lightning.

BACKGROUND OF THE INVENTION

A thyristor, that is, a PNPN device with a gate terminal, can be used to protect an electrical transmission system from transient voltages. A thyristor connected in shunt with a signal line of a telephone system, for example, has a low-current high-impedance state during normal conditions and switches to a high current low impedance state should the conditions change to cause the line voltage to go below the gate voltage of the device, the thyristor being so connected that its outer P-type region is positive with respect to its outer N-type region and its gate electrode is not positive relative to its outer N-type region.

A thyristor connected in shunt with a signal line recovers to its low-current high impedance state following the occurrence of a voltage on the signal line causing its conduction because the thyristor requires a current above a set level to keep it in its low impedance state after it has been switched on. That current is the holding current for the thyristor and must exceed the current which can be obtained through the signal line, in order that the thyristor returns to its high-impedance state following the occurrence of a transient voltage which switches it on.

A thyristor can be designed to have a high holding current, but such a thyristor requires a high gate current and, in a system protected by the device, the high gate current which the device draws can charge the system capacitance to a voltage high enough to provide a voltage damaging to many components.

SUMMARY OF THE INVENTION

A first aspect of the present invention is that it provides a semiconductor integrated circuit including a PNPN device and a junction bipolar transistor having a current gain of at least 10 and base-collector and base-emitter junctions with reverse breakdown voltages of at least 50 volts, means connecting the collector region of the bipolar transistor to that outer region of the PNPN device which is of the opposite conductivity type to the collector region of the bipolar transistor, means connecting the emitter region of the bipolar transistor to that inner region of the PNPN device which is of the opposite conductivity type to the emitter region of the bipolar transistor, means connected to the base region of the bipolar transistor forming a control terminal for the integrated circuit, and means connected to the respective outer regions of the PNPN device forming an input and an output terminal for the integrated circuit.

The present invention provides a semiconductor integrated circuit which can have a high holding current without the penalty of a high gate current.

A second aspect of the present invention is that it provides a semiconductor integrated circuit including a first plurality of doped regions forming a PNPN device, a second plurality of doped regions forming a junction bipolar transistor, a further doped region of the same conductivity type as the collector region of the bipolar transistor and more heavily doped than the collector region, that further doped region separating the first plurality of doped regions from the second plurality of doped regions, means connecting the collector region of the bipolar transistor to that outer region of the PNPN device which is of the opposite conductivity type to the collector region of the bipolar transistor, means connecting the emitter region of the bipolar transistor to that inner region of the PNPN device which is of the opposite conductivity type to the emitter region of the bipolar transistor, means connected to the base region of the bipolar transistor forming a control terminal for the integrated circuit, and means connected to the respective outer regions of the PNPN device forming an input and an output terminal for the integrated circuit.

The present invention provides, also, a semiconductor integrated circuit including a PNPN device and a bipolar transistor in which a further doped region of the same conductivity type as the transistor collector region, and more heavily doped than the collector region, prevents the devices affecting each other.

Preferably, in a semiconductor integrated circuit including first and second pluralities of doped regions forming, respectively, a PNPN device and junction bipolar transistor, the junction bipolar transistor has a current gain of at least 10 and base-collector and base-emitter junctions with reverse breakdown voltages of at least 50 volts.

Preferably, the current gain of the bipolar transistor lies within the range 10 to 150, in either of the semiconductor integrated circuits.

Preferably, the current gain of the bipolar transistor lies within the range 80 to 120, in either of the semiconductor integrated circuits.

Preferably, the bipolar transistor has a base-emitter junction with a reverse breakdown voltage in the range 50 to 120 volts, in either of the semiconductor integrated circuits.

Preferably, the bipolar transistor has a base-emitter junction with a reverse breakdown voltage in the range 80 to 100 volts, in either of the semiconductor integrated circuits.

Preferably, the bipolar transistor has base-emitter and base-collector junctions with breakdown voltages substantially equal to each other, in either of the semiconductor integrated circuits.

Preferably, the base region of the bipolar transistor has a depth several times that of its emitter region in either of the semiconductor integrated circuits.

Preferably, the base region of the bipolar transistor has a depth of the order of ten times that of its emitter region.

Preferably, the base region of the bipolar transistor has an impurity concentration of between 1.5 and 2.5 times that of its collector region, in either of the semiconductor integrated circuits.

Preferably, the bipolar transistor includes a ring of semiconductor material, of the same conductivity type as its base region and more heavily doped than the base region, extending down into the collector region from a surface common to the base, collector and emitter regions, in either of the semiconductor integrated circuits.

Preferably, both semiconductor integrated circuits include a PN junction diode having its P-type region contiguous with the inner P-type region of the PNPN device, its N-type region contiguous with the inner N-type region of the PNPN device, means connecting the N-type region of the PNPN device with the P-type region of the PN diode, and means connecting the P-type region of the PNPN device with the N-type region of the diode.

Preferably, the N-type region of the PN junction diode includes a main N-type bulk and an additional N-type body of higher impurity concentration than the main N-type bulk, and the main N-type bulk is thinner than the inner N-type region of the PNPN device.

Preferably, the inner P-type region of the PNPN device includes a plurality of projections which penetrate the outer N-type region of the PNPN device, in either of the semiconductor integrated circuits.

Preferably, the inner N-type region of the PNPN device includes a main N-type bulk and at least one additional N-type body of higher impurity concentration than the main N-type bulk, and the or each additional N-type body is adjacent to the outer P-type region of the PNPN device, in either of the semiconductor integrated circuits.

The present invention provides, also a compound semiconductor integrated circuit including two semiconductor integrated circuits as defined above, fabricated in a semiconductor block, wherein the outer P-type regions of the PNPN device are connected together, a plurality of semiconductor integrated circuits as, defined above, housed in a package and a plurality of compound semiconductor integrated circuits, as defined above housed in a package.

BRIEF DESCRIPTION OF THE DRAWINGS

A semiconductor integrated circuit in a accordance with both aspects of the invention will now be described by way of example only with reference to the accompanying drawings, in which.

DESCRIPTION OF THE PREFERRED EMBODIMENT

Figure 1:
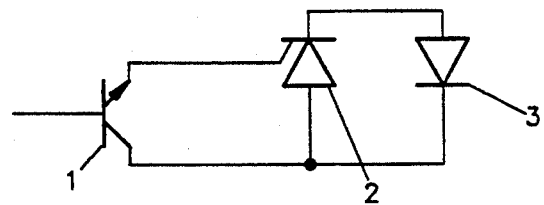
FIG. 1 is a circuit diagram of the semiconductor integrated circuit.

Referring to FIG. 1 of the accompanying drawings, the semiconductor integrated circuit includes an NPN transistor 1 the collector electrode of which is connected to the anode electrode of a PNPN device 2. The emitter electrode of the NPN transistor 1 is connected to the gate electrode of the PNPN device 2. The cathode electrode of the PNPN device 2 is connected to the anode electrode of a diode 3 and the anode electrode of the PNPN device 2 is connected to the cathode electrode of the diode 3. The anode and cathode electrodes of the PNPN device 2 are the main terminals of the integrated circuit, and the base electrode of the NPN transistor 1 is the control terminal of the integrated circuit.

The NPN transistor 1 has an emitter-base reverse breakdown voltage of around 100 volts and has a current gain ($h_{fe}$) of around 100. The NPN transistor 1 has a planar structure and the higher than normal emitter-base reverse breakdown voltage is provided by a structure having a base region with a relatively low doping level compared with a conventional planar transistor. For example, whereas the base region of a conventional planar bipolar transistor has a doping level of the order of $10^{18}$ to $10^{19}$ atoms/cms$^3$, the base region of the NPN transistor 1 has a doping level of between $1.1 \times 10^{16}$ and $2.2 \times 10^{16}$ atoms/cm$^3$. The emitter and collector regions of the NPN transistor 1 have doping levels of the order of $10^{21}$ atoms/cm$^3$ and $10^{15}$ atoms/cm$^3$, respectively, which are average levels for a conventional planar bipolar transistor. The doping levels are those at the surface of the devices. The base-collector junction of the NPN transistor 1 also has a reverse breakdown voltage of around 100 volts.

Figure 2:
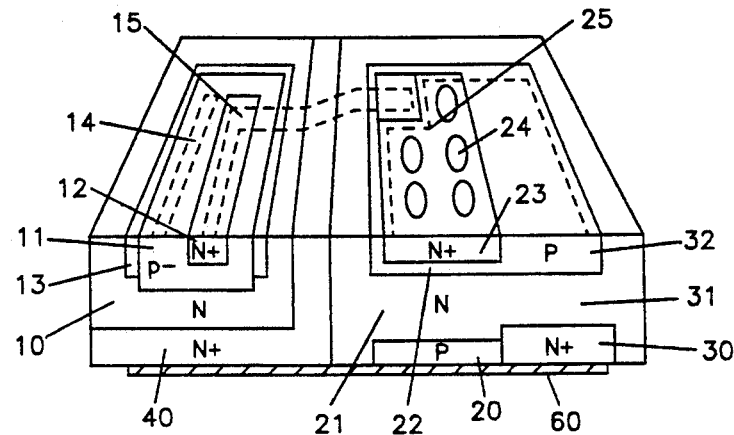
FIG. 2 shows a perspective view of a transverse cross-section of the semiconductor integrated circuit.

Referring to FIG. 2 of the accompanying drawings, the NPN bipolar planar transistor of the integrated circuit device is formed in a rectangular semiconductor block and includes an N-type collector body 10, a P-type base body 11, an N-type emitter body 12, and a P$^+$-type ring 13 which lies between P-type base body 11 and the N-type collector body 10 at the common surface of the collector, base and emitter bodies of the NPN bipolar planar transistor. The depth of the N-type emitter body 12 is of the order of 5 microns and the depth of the P-type base body 11 is of the order to 50 microns, that is, the depth of the base body is of the order of 10 times the depth of the N-type emitter body 12. As has been explained above, the concentration of the impurity in the P-type base body 11 lies between $1.1 \times 10^{16}$ and $2.2 \times 10^{16}$ atoms/cm$^3$. A base impurity level of the order of $1.5 \times 10^{16}$ atoms/cm$^3$ provides a base-emitter reverse breakdown voltage of the order of 100 volts, whereas a conventional planar transistor with a base impurity level of the order of $10^{18}$ atoms/cm$^3$ has a base emitter reverse breakdown voltage of the order of 12 volts. The P-type base region of this NPN bipolar transistor is some about 5 times as deep as that of a conventional planar transistor and the transistor has a current gain of the order of 100.

The PNPN device is formed in a rectangular block of semiconductor material which is separated from the NPN bipolar transistor by a heavily dopes N-type region 40. The PNPN device includes an outer P-type anode body 20, an inner N-type body 21, an inner P-type body 22, and an outer N-type cathode body 23. A plurality of projections 24 from the P-type cathode body 22 penetrate the N-type cathode body 23.

The heavily doped N-type (N$^+$) region 40 runs along the lower (as viewed) surface of the block in which the NPN bipolar transistor is formed, in contact with the collector body 10 of the NPN bipolar transistor, and continues upwards (as viewed) to the upper surface of the semiconductor integrated circuit in contact with the collector body 10 and the inner N-type body 21, of the PNPN device.

A PN junction diode is also formed in a rectangular block of semiconductor material and that block of material is contiguous with the block in which the PNPN device is formed. The anode electrode of the PN diode is an extension 32 of the P-type body 22 of the PNPN device and the cathode electrode of the PN diode is an extension 31 of the inner N-type region 21 of the PNPN device. The PN diode also includes an N$^+$-type body 30 which is separated from the P-type extension 32 by the N-type extension 31. The N$^+$-type body 30 reduces the thickness of the N-type extension 31 compared with region 21.

The semiconductor integrated circuit includes a metallization layer 60 on its lower surface (as viewed in the figure) which connects together the P-type anode body 20 of the PNPN device, the N+-type body 30 of the PN diode, and the N+-type body 40 which acts, in effect as a connection to the N-type collector body of the NPN transistor. The semiconductor integrated circuit also includes a metallization layer 15 on its upper surface (as viewed in the figure) which connects the N+-type emitter body 12 of the transistor to the inner P-type body 22 of the PNPN device. A further metallization layer 14 provides a connection to the P-type base body of the NPN transistor.

The N+-type region 40 which separates the N-type collector body 10 of the NPN transistor from the inner N-type body 21 of the PNPN serves to absorb mobile charge carriers from both the N-type collector body 10 and the inner N-type body 21, and, thereby, prevent cross-coupling between those two bodies.

The N+-type body 30 serves to control the depth of the N-type body 31. Deepening of the N+-type body 30 results in a PN diode with higher switching speed because of the accompanying reduction in the depth of the N-type body 21.

The projections 24 of the P-type body 22 which penetrate the N+-type cathode body 23 serves to increase the holding current of the PNPN device, since the PNPN device and the PN diode have a shared metallization layer 25 on their common upper surface (as viewed in the figure) which, in effect, short circuits some of the junction between the bodies 22 and 23. Increasing the number of projections 24 increases the holding current of the device.

The PN diode included in the semiconductor integrated circuit may be omitted, although it is preferable to include it.

Figure 3:
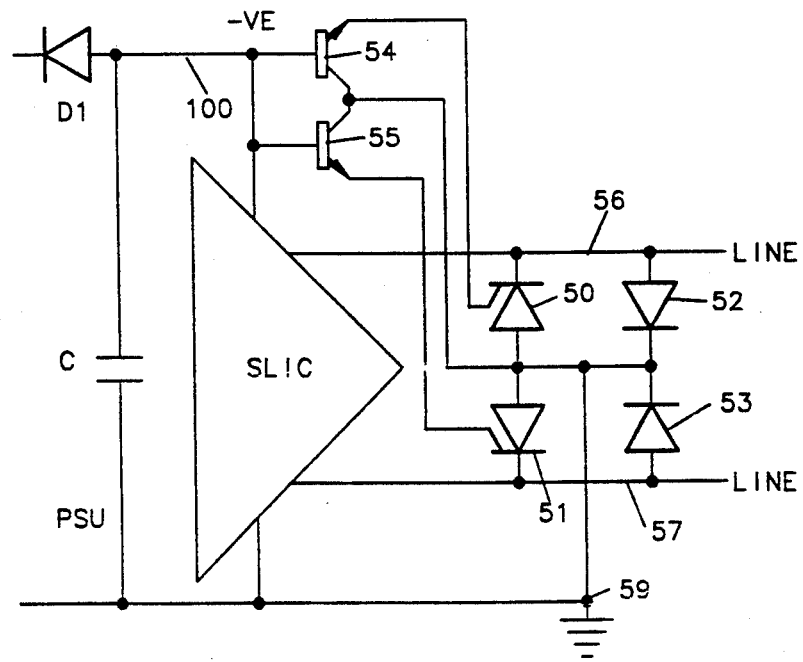
FIG. 3 is a circuit diagram of a compound semiconductor integrated circuit connected to telephone lines.

Referring to FIG. 3 of the accompanying drawings, the compound semiconductor integrated circuit includes two of the integrated circuits shown in FIGS. 1 and 2. In the compound semiconductor integrated circuit, a first PNPN device 50, is connected anode-to-anode with a second PNPN device 51, a first PN diode 52 is connected cathode-to-cathode with a second PN diode 53, and a first NPN transistor 54 is connected collector-to-collector NPN transistor 55. The collectors of the transistors 54 and 55, the cathodes of the PN diodes 52 and 53, and the anodes of the PNPN devices 50 and 51 are connected together. The emitter of the transistor 54 is connected to the gate of the PNPN device 50 and the emitter of the transistor 55 is connected to the gate of the PNPN device 51. The cathode of the PNPN device 50 is connected to the anode of the PN diode 52 and to a first signal line 56 of a telephone system, and the cathode of the PNPN device 51 is connected to the anode of the PN diode 53 and to a second signal line 57 of the telephone system. The bases of the transistors 54 and 55 are connected together and to the negative voltage supply terminal 100 of the subscriber line interface circuit (SLIC) belonging to the telephone system. The capacitance of the voltage supply for the system is shown as a capacitor 58.

In normal operation, the signal lines 56 and 57 are at substantially the same voltage as the negative voltage supply terminal of the system, and the transistors 54 and 55 are switched off. A negative-going transient voltage occurring on the first signal line 56 triggers the PNPN device 50 which switches to its low-impedance state and connects the first signal line 56 to the earth terminal 59 for the system, quenching the disturbance. The NPN transistor 54 supplies the gate current of the PNPN device 50 when it is in its low-impedance state. The PNPN device 51 acts to quench negative-going transient voltages occurring on the second signal line 57. Positive-going transient voltages are quenched by the diodes 52 and 53.

The provision of the transistors 54 and 55 to supply the gate currents of the PNPN devices 50 and 51 serves to limit the current drawn from the negative voltage supply terminal 100 of the system to the base currents of the transistors 54 and 55. Current drawn from the negative voltage supply terminal 100 in response to a transient disturbance result in the charging of the capacitor 58 negatively, and the drawing of a current of the order of 100 mA is likely to result in the voltage change at the capacitor 58 being large enough to cause the voltage applied to the SLIC to exceed its maximum rating. A high holding current PNPN device may be expected to have a holding current of the order of 150 mA and a gate current of the order of 100 mA, so the use of a PNPN device without the transistors is likely to lead to the destruction of the SLIC from charge accumulated by the capacitor 58.

In normal operation, the collector terminals of the transistors 54 and 55 are maintained at zero volts and both junctions of the transistors 54 and 55 are subjected to reverse voltages of about 50 volts which is the supply voltage. The provision of transistors with junctions capable of withstanding at least 50 volts ensures that the transistors are not damaged and do not need diode protection.

Referring to FIG. 2, the N+-type region 40 serves to prevent cross coupling between the NPN bipolar transistor and the PNPN device, that is, the N+-type region 40 serves to prevent charges from one device affecting the operation of the other. More specifically, it serves to reduce the chances of the semiconductor integrated circuit failing to switch off sharply after it has been rendered conductive by a voltage transient.

The heavily doped P-type ring 13 serves to prevent surface channel currents around the relatively lightly doped base to body 11 of the NPN bipolar transistor.

I claim:

1. A semiconductor integrated circuit including a PNPN device of opposite conductivity N-type and P-type materials having an outer surface N-type region, an inner P-type region contained within the PNPN device, an inner N-type region contained within the PNPN device and an outer surface P-type region and a junction bipolar transistor of opposite conductivity N-type and P-type materials having a collector region, a base region and an emitter region with base-collector and base-emitter junctions, said junction bipolar transistor having a current gain of at least 10 and the base-collector and the base-emitter junctions with reverse breakdown voltages of at least 50 volts, means connecting the collector region of the bipolar transistor to that outer surface region of the PNPN device which is of the opposite conductivity type to the collector region of the bipolar transistor, means connecting the emitter region of the bipolar transistor to that inner region of the PNPN device which is of the opposite conductivity type to the emitter region of the bipolar transistor, means connected to the base region of the bipolar transistor for forming a control electrode terminal for the integrated circuit, and means connected to the respective outer surface P-type and N-type regions of the PNPN device for forming an input and an output terminal for the integrated circuit.

2. A semiconductor integrated circuit including a first plurality of doped regions forming a PNPN device of opposite conductivity N-type and P-type materials having an outer surface N-type region, an inner P-type region contained within the PNPN device, an inner N-type region contained within the PNPN device and an outer surface P-type region, a second plurality of doped regions forming a junction bipolar transistor of opposite conductivity N-type and P-type materials, said junction bipolar transistor having a collector region, a base region and an emitter region, a further doped region of the same conductivity type as the collector region of the bipolar transistor and more heavily doped than said collector region, that further doped region separating the first plurality of doped regions for the PNPN device from the second plurality of doped regions for the bipolar junction transistor, means connecting the collector region of the bipolar transistor to that outer surface region of the PNPN device which is of the opposite conductivity type to the collector region of the bipolar transistor, means connecting the emitter region of the bipolar transistor of that inner region of the PNPN device which is of the opposite conductivity type to the emitter region of the bipolar transistor, means connected to the base region of the bipolar transistor for forming a control electrode terminal for the integrated circuit, and means connected to the respective P-type and N-type outer surface regions of the PNPN device for forming an input and an output terminal for the integrated circuit.

3. A semiconductor integrated circuit as claimed in claim 2, wherein the junction bipolar transistor has a current gain of at least 10 and base-collector and base-emitter junctions with reverse breakdown voltages of at least 50 volts.

4. A semiconductor integrated circuit as claimed in claim 3, wherein the current gain of the bipolar transistor lies within the range 10 to 150.

5. A semiconductor integrated circuit as claimed in claim 4, wherein the current gain of the bipolar transistor lies within the range 80 to 120.

6. A semiconductor integrated circuit as claimed in claim 3, wherein the bipolar transistor has a base-emitter junction with a reverse breakdown voltage in the range 50 to 120 volts.

7. A semiconductor integrated circuit as claimed in claim 6, wherein the bipolar transistor has a base-emitter junction with a reverse breakdown voltage in the range 80 to 100 volts.

8. A semiconductor integrated circuit as claimed in claim 3, wherein the bipolar transistor has base-emitter and base-collector junctions with breakdown voltages substantially equal to each other.

9. A semiconductor integrated circuit as claimed in claim 3, wherein the base region of the bipolar transistor has a depth several times that of its emitter region.

10. A semiconductor integrated circuit as claimed in claim 9, wherein the base region of the bipolar transistor has a depth of the order of ten times that of its emitter region.

11. A semiconductor integrated circuit as claimed in claim 3, wherein the base region of the bipolar transistor has an impurity concentration of between essentially 1.5 and 2.5 times that of its collector region.

12. A semiconductor integrated circuit as claimed in claim 3, wherein the bipolar transistor includes a ring of semiconductor material, of the same conductivity type as its base region and more heavily doped than the base region, extending down into the collector region from a surface common to the base, collector and emitter regions.

13. A semiconductor integrated circuit as claimed in claim 3, including a PN junction diode of P-type conductivity materials and N-type conductivity materials forming P-type regions and N-type regions having its P-type region contiguous with the inner P-type region of the PNPN device and its N-type region contiguous with the inner N-type region of the PNPN device, means connecting the outer N-type region of the PNPN device with the P-type region of the PN diode, and means connecting the outer P-type region of the PNPN device with the N-type region of the diode.

14. A semiconductor integrated circuit as claimed in claim 13, wherein the N-type region of the PN junction diode includes a main N-type bulk and an additional N-type body of higher concentration than the main N-type bulk, and the main N-type bulk is thinner than the inner N-type region of the PNPN device.

15. A semiconductor integrated circuit as claimed in claim 3, wherein the inner P-type region of the PNPN device includes a plurality of projections which penetrate the outer N-type region of the PNPN device.

16. A semiconductor integrated circuit as claimed in claim 1, wherein the inner N-type region of the PNPN device includes a main N-type bulk and at least one additional N-type body of higher impurity concentration than the main N-type bulk, and at least one additional N-type body is adjacent to the outer P-type region of the PNPN device.

17. A compound semiconductor integrated circuit including two semiconductor integrated circuits as claimed in claim 3 fabricated in a semiconductor block, wherein the outer P-type regions of the PNPN device are connected together.

* * * * *